(12) United States Patent
Cotton et al.

(10) Patent No.: US 10,470,304 B2
(45) Date of Patent: Nov. 5, 2019

(54) FLEXIBLE ELECTRONICS APPARATUS AND ASSOCIATED METHODS

(71) Applicant: Nokia Technologies Oy, Espoo (FI)

(72) Inventors: Darryl Cotton, St. Ives (GB); Mark Allen, Great Cambourne (GB); Piers Andrew, Highfields Caldecote (GB); Adam Robinson, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/126,012

(22) PCT Filed: Mar. 3, 2015

(86) PCT No.: PCT/FI2015/050131
§ 371 (c)(1),
(2) Date: Sep. 14, 2016

(87) PCT Pub. No.: WO2015/140392
PCT Pub. Date: Sep. 24, 2015

(65) Prior Publication Data
US 2017/0086291 A1    Mar. 23, 2017

(30) Foreign Application Priority Data

Mar. 21, 2014    (GB) .................................. 1405081.9

(51) Int. Cl.
*H05K 1/02* (2006.01)
*H01L 23/538* (2006.01)
(Continued)

(52) U.S. Cl.
CPC ....... *H05K 1/0283* (2013.01); *H01L 23/5385* (2013.01); *H01L 23/5387* (2013.01);
(Continued)

(58) Field of Classification Search
USPC ......................................................... 361/749
See application file for complete search history.

(56) References Cited

U.S. PATENT DOCUMENTS

2002/0197002 A1    12/2002    Lin .................................. 385/18
2006/0286785 A1    12/2006    Rogers et al. ................ 438/584
(Continued)

FOREIGN PATENT DOCUMENTS

EP    1 783 555 A2    5/2007
JP    2001/358422 A    12/2001
(Continued)

OTHER PUBLICATIONS

Machine Translation of Sueoka, Kazuhiko et al. (Japanese Patent Publication No. 2010-251706), Nov. 4, 2010.*
(Continued)

*Primary Examiner* — Tremesha S Willis
(74) *Attorney, Agent, or Firm* — Harrington & Smith (57) ABSTRACT

An apparatus including a flexible substrate; and an overhanging electronic component island, the electronic component island configured to be less flexible than the flexible substrate and including one or more electronic components, wherein the electronic component island includes a substrate-face with a connection portion and an overhang portion, the connection portion being mechanically coupled to a surface of the flexible substrate via a single connection-support pad and the overhang portion configured to overhang and be substantially free of the underlying flexible substrate such that the underlying flexible substrate can be strained independently from the overhang portion under operational strains of the flexible substrate.

19 Claims, 7 Drawing Sheets

(51) Int. Cl.
  *H02S 40/36* (2014.01)
  *H01L 31/02* (2006.01)
  *H01L 31/0392* (2006.01)
  *H05K 1/14* (2006.01)
  *H05K 1/18* (2006.01)
  *H05K 3/36* (2006.01)
  *H01L 51/00* (2006.01)

(52) U.S. Cl.
  CPC .. *H01L 31/02008* (2013.01); *H01L 31/03926* (2013.01); *H02S 40/36* (2014.12); *H05K 1/142* (2013.01); *H05K 1/144* (2013.01); *H05K 1/189* (2013.01); *H05K 3/361* (2013.01); *H01L 51/0097* (2013.01); *H01L 2224/16225* (2013.01); *H05K 2201/042* (2013.01)

(56) References Cited

U.S. PATENT DOCUMENTS

| | | | |
|---|---|---|---|
| 2007/0029671 A1 | 2/2007 | Yamasaki | 257/737 |
| 2010/0140785 A1 | 6/2010 | Killer et al. | 257/693 |
| 2011/0309526 A1* | 12/2011 | Cho | H01L 21/563 257/777 |
| 2012/0069584 A1 | 3/2012 | Kawabe et al. | 362/382 |
| 2014/0027053 A1 | 1/2014 | Uetani et al. | 156/268 |

FOREIGN PATENT DOCUMENTS

| | | |
|---|---|---|
| JP | 2004126058 A | 4/2004 |
| JP | 2005-209729 A | 8/2005 |
| JP | 2006-5026 | 1/2006 |
| JP | 2007-250998 | 9/2007 |
| JP | 2008-204037 A | 9/2008 |
| JP | 2008-235594 A | 10/2008 |
| JP | 2009094099 A | 4/2009 |
| JP | 2010177345 A | 8/2010 |
| JP | 2010-251706 | 11/2010 |
| JP | 2013187308 A | 9/2013 |
| KR | 2008-0043068 | 5/2008 |
| WO | WO-2007-097366 A1 | 8/2007 |
| WO | WO-2010109844 A1 | 9/2010 |
| WO | WO-2010/131578 A1 | 11/2010 |
| WO | WO-2012/133530 A1 | 10/2012 |
| WO | WO 2013/019510 A1 | 2/2013 |
| WO | WO-2013/165681 A1 | 11/2013 |

OTHER PUBLICATIONS

Nakanishi (Machine Translation of Japanese Patent Publication No. 2009-094099), Apr. 30, 2009. (Year: 2009).*

* cited by examiner

FLEXIBLE ELECTRONICS APPARATUS AND ASSOCIATED METHODS

TECHNICAL FIELD

The present disclosure relates to the field of electronic circuits, associated methods and apparatus, and in particular concerns flexible apparatus, particularly for use in flexible electronic applications. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs. Certain disclosed examples may find applications in packaging, wearable devices/sensors and biosensors.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

It is possible to combine electronic components and flexible substrates to form flexible (including stretchable) electronic apparatus and devices. Different techniques may be used in creating such flexible apparatus/devices, such as roll-to-roll mass-printing of components, and direct-write printing methods. The development of flexible electronics remains limited by the relative inability of materials to withstand mechanical deformation. In particular, the rigidity of certain electronic components make it difficult to incorporate them into flexible apparatus/devices.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is an apparatus comprising:
   a flexible substrate; and
   an overhanging electronic component island, the electronic component island configured to be less flexible than the flexible substrate and comprising one or more electronic components,
      wherein the electronic component island comprises a substrate-face with a connection portion and an overhang portion, the connection portion being mechanically coupled to a surface of the flexible substrate via a single connection-support pad and the overhang portion configured to overhang and be substantially free of the underlying flexible substrate such that the underlying flexible substrate can be strained independently from the overhang portion under operational strains of the flexible substrate.

The overhang portion of the electronic component island may be substantially free of flexing or stretching under operational strains of the flexible substrate given that it is substantially free of the underlying flexible substrate under normal/typical in-use conditions. This may allow the flexing and/or stretching (and compressing) of the substrate not to be impeded as much by the electronic component island as would be the case if, for example, the entire surface of the electronic component island were mechanically coupled to the substrate.

The single connection-support pad may be configured to provide mechanical connection between connection portion of the electronic component island and the flexible substrate over a single contiguous area. The single connection support pad may consist of one or more parts (e.g. electrical connectors, insulating supports) joined together to form one unit.

The term "flexible" is used to refer to material which may be bent, stretched, compressed, and/or otherwise strained. Thus the flexible substrate may be a bendable substrate, a stretchable substrate, and/or a compressible substrate. Accordingly the term "flexed" may be considered to relate to a strainable substrate and includes one or more of bending, stretching, and compressing. The flexible substrate may or may not be resilient. For example, it may be elastically or plastically strainable under operational conditions.

The connection-support pad may be configured to provide support to the electronic component island to keep the electronic component island away from the underlying flexible substrate in an overhanging position.

One or more of the dimensions and material composition of the connection-support pad may be configured to provide for the support. For example, the connection support pad may be rigid (e.g. rigid relative to the flexible substrate). The length of the connection support pad may be greater than a minimum value relative to the length of the electronic island along all axes. For example, the length of the connection support pad may be greater than a 5% of the length of the electronic island along all axes.

The adhesion (e.g. provided by an adhesion layer) of the connection-support pad to the electronic component island and the flexible substrate may be configured to provide the support. For example, the connection-support pad may be bonded to the electronic island such that the electronic island cannot be moved independently of the connection support pad. That is, the adhesion may be such that the connection-support pad and electronic component island forms a single rigid unit.

The connection-support pad may be configured to provide support to at least the weight of the electronic component island to keep the electronic component island away from the underlying flexible substrate in an overhanging position region under operational strains of the flexible substrate.

The connection-support pad may be configured to provide support by resisting one or more bending moments on the electronic component island to keep the electronic component island away from the underlying flexible substrate in an overhanging position region under operational strains of the flexible substrate. For example, the connection support pad may be configured to be more rigid than the flexible substrate. The connection support pad may be configured to be at least as rigid as the electronic component island.

In an unstrained configuration, the electronic component island may be configured to extend beyond the area enclosed by the connection-support pad of the island so as to overlap one or more other neighbouring electronic component islands.

The connection-support pad and the electronic component island may be configured to electrically connect the one or more electronic components to the underlying flexible substrate.

The connection-support pad may provide electrical connection as well as a mechanical connection.

The apparatus may comprise a plurality of electronic component islands, each electronic component island comprising a one or more of electronic components.

The connection-support pad may be positioned within the edges of the electronic component island.

The connection-support pad may be positioned substantially centrally within the edges of the electronic component island.

The connection-support pad may be positioned at an edge of the electronic component island, substantially in a cantilever configuration.

The electronic component island may be configured to be planar.

The electronic component island may be formed from a material with modulus in the range of 1 GPa to 1 TPa.

The flexible substrate may comprise circuitry configured to connect the one or more electrical components to other electrical components.

The electronic component island may be configured to be positioned at a different height above the flexible substrate surface than a neighbouring electronic component island to permit overlap between the neighbouring electronic component islands. This height may be measured from the substrate-face of the electronic component island and the flexible substrate surface. The different heights may be substantially provided by the connection-support pads comprising pillars of differing heights.

The electronic component island may be configured to lie on the surface of the flexible substrate (in at least some strain configurations), such that when the flexible substrate is stretched and or bent away from the electronic component island, the strain of the flexible substrate is not transferred to the overhang portion of the electronic component island.

The length of the connection portion may be less than 50% of the overall length of the electronic component island along at least one axis.

The length of the connection portion may be less than one of 45%, 40%, 35%, 30%, 25%, 20%, 15%, 10%, 5% of the overall length of the electronic component island along at least one axis.

The length of the connection portion may be at least 3% of the overall length of the electronic component island along at least one axis.

The length of the connection portion is in the range of one of 45%-40%, 40%-35%, 35%-30%, 30%-25%, 25%-20%, 20%-15%, 15%-10%, 10%-5%, 5%-3% of the overall length of the electronic component island along at least one axis.

The connection-support pad may comprise a pillar which is one of column shaped or tapering shaped, wherein the tapering shaped comprises one of thicker towards the substrate-face end or thicker towards the flexible substrate end.

The flexible substrate may be configured to allow for one or more of bending, extending, and compressive strains.

The operational strains of the flexible substrate may be of the order of at least one of between 5 and 10%, between 5 and 20%; 5 and 30%; and between 5 and 40%.

Strain, $\varepsilon$, may be defined as the ratio of the extension of the material, $\Delta L$, to the length of the unstressed material, $L$. That is, $\varepsilon = \Delta L / L$. Stress, $\alpha$, may be defined as force, $F$, applied to a material per unit area, $A$. That is, $\alpha = F/A$.

The apparatus may comprise part of packaging, a wearable device (e.g. a watch), a wearable sensor, a biosensor (e.g. a heart-rate monitor) or other portable electronic device. The apparatus may comprise a low-elastic-modulus adhesive between the electronic component island and the flexible substrate, the low-elastic-modulus adhesive configured to join the component island to the substrate and substantially inhibit stresses in the component island caused by flexing of the flexible substrate. Thus the low-elastic-modulus adhesive may be located between the component island and the flexible substrate and configured to substantially mechanically decouple the component island from the flexible substrate. Advantageously, the adhesive may substantially inhibit stress or strain of the flexed substrate passing on to the overlying electronic component island, which may in some examples be relatively brittle compared with the substrate. The adhesive may be considered to act as a stress/strain absorbing "cushion", adhering the component island to the substrate and reducing forces which may be applied to the component island due to flexing of the underlying substrate. The low modulus adhesive may comprise a urethane or silicone based elastomeric adhesive, for example.

The flexible substrate may comprise circuitry configured to connect the electrical component to other electrical components. The circuitry may comprise a curved interconnection portion electrically interconnecting the one or more electrical components to other electrical components, wherein the curved interconnection is configured such that its curvature allows the interconnection to maintain its connection to the respective connection-support pads with operational straining of the flexible substrate.

The term "curved" is used to describe an interconnection (or other object such as a supporting medium profile) which is not straight unless reaching the maximum operational extension strains, for example. Thus "curved" may be understood to encompass non-straight, nonlinear, curvilinear, arced, bowed, buckled, humped, serpentine and/or arciform, for example under at least mid-range operations strain conditions. A curved interconnection may have one or more bends or folds, such that it may be "C" shaped, "U" shaped, "V" shaped, "S" shaped, or have more than one or two bends/curves, for example. The curved interconnection may allow for flexing of the flexible substrate such that the shape of the curved interconnection may freely change and accommodate for the change in the relative locations of the connection-support pad and substrate pad to which the curved interconnection is connected without the interconnection breaking.

The apparatus may comprise multiple layers, each layer comprising a flexible substrate and coupled electronic component islands.

The electronic component islands of a multiple layer embodiment may be spaced apart during operational straining by spacers, the spacers being rigid relative to the flexible substrate.

A component may comprise: a rigid packaged electronic component such as a surface-mount (SMD) component (e.g., resistor, capacitor, inductor, diode, transistor, operational amplifier, light-emitting diode, sensor etc.); a rigid component such as a bare silicon-based component or a microchip; a die; an integrated chip; a flexible component (e.g., flexible light-emitting diode, or flexible sensor); a packaged component (e.g. multi-pin processor chip); or a combination of one or more rigid or thin-film based electronic components (e.g. thin-film photovoltaic cell, thin-film battery) mounted on a flexible module (smaller than the flexible substrate) which together make up the component with component connection-support pads. The component island may comprise one or more solar panels, or one or more pixels of a display.

The flexible component may be formed by: roll-to-roll printing (for example, flexographic printing, gravure printing, and rotary screen printing), sheet-fed printing (for example, screen and stencil printing), direct-write printing (for example, inkjet printing, aerosol jet printing, and dispensing), wet-coating (for example, spin-coating, bar-coating, and blade-coating), vacuum-deposition (for example evaporation, sputtering, chemical vapour deposition). In other examples a component (flexible or rigid) may be formed by transferring a pre-formed component.

The interconnections may be formed by: roll-to-roll printing (for example, flexographic printing, gravure printing, and rotary screen printing), sheet-fed printing (for example, screen and stencil printing), direct-write printing (for example, inkjet printing, aerosol jet printing, and dispensing), vacuum-deposition (for example, evaporation and sputtering, and chemical vapour deposition, in some examples through a mask), or transferring a pre-formed/pre-moulded curved interconnection.

The curved interconnection may be unsupported between the substrate and the electronic component island. The curved interconnection may be supported on a supporting structure/medium located between the substrate and connection-support pads. Advantageously, in the former case, it may be possible to form a so-called "air-suspended" interconnection which is not supported by a supporting medium in some examples, and it may be, in the latter case, possible to form a supported curved interconnection in other examples.

The curved interconnection may be supported on a supporting structure/medium, and the supporting structure/medium may comprise one or more of a supporting layer configured to form a bridge between the flexible substrate and connection-support pads, and a supporting structure/medium configured to fill a space between lateral edges of the substrate and connection-support pads. Such a supporting layer may have a thickness of between 30 nm and 50 µm.

The flexible substrate may be one of: a polymer film (for example, polyethylene terephthalate, polyethylene naphthalate, polyimide, polycarbonate, polyethersulfone, polysulfone, polyether etherketone, polyphenylene ether, polyethylene, polypropylene, poly(methylmethacrylate), a metal foil (for example, thin stainless steel, aluminium foil), a flexible printed circuit (FPC) (for example, polyimide laminate with copper wiring); a flexible printed wiring board (PWB) laminate; a woven or wearable fabric (for example, fabric woven from non-conducting or conducting yarn), an elastomer (for example, polydimethylsiloxane (PDMS), polyurethane, polyvinylchloride, chloroprene rubber, or nitrile rubber), paper, or a stack comprising two or more of these materials laminated into one flexible substrate. Elastomer-based flexible substrates may be particularly suitable for stretchable electronic applications.

The curved interconnection may comprise a conducting medium which may be a conductive ink. The conducting medium/curved interconnection may comprise silver, gold or copper, another metal or another conducting material, or a continuous interconnected array of carbon nanotubes, graphene flakes, or silver nanowires, for example. The curved interconnection may have a thickness between 1 nm and 50 µm.

According to a further aspect, there is provided a method of manufacturing an apparatus comprising:
  providing a flexible substrate; and
  providing an overhanging electronic component island, the electronic component island configured to be less flexible than the flexible substrate and comprising one or more electronic components,
  wherein the electronic component island comprises a substrate-face with a connection portion and an overhang portion, the connection portion being mechanically coupled to a surface of the flexible substrate via a single connection-support pad and the overhang portion configured to overhang and be substantially free of the underlying flexible substrate such that the underlying flexible substrate can be strained independently from the overhang portion under operational strains of the flexible substrate.

The flexible substrate and/or the overhanging electronic component island may be provided using roll-to-roll lamination techniques. The flexible substrate and/or the overhanging electronic component island may be provided using roll-to-roll printing techniques.

The method may comprise providing multiple layers, each layer comprising a flexible substrate and coupled electronic component islands.

A sacrificial material may be used to support parts of the apparatus (e.g. portions of serpentine interconnects, or the overhanging portion of the electronic component island) as they are being formed, and wherein the sacrificial material is removed after the supported parts have been formed to decouple the parts from the underlying structure.

According to a further aspect, there is provided a computer program comprising computer code configured to perform any claimed method.

According to a further aspect, there is provided an apparatus comprising:
  a flexible substrate; and
  an overhanging electronic component island, the electronic component island configured to be less flexible than the flexible substrate and comprising one or more electronic components,
  wherein the electronic component island comprises a substrate-face with a connection portion and an overhang portion, the connection portion being mechanically coupled to a surface of the flexible substrate via one or more connection-support pads and the overhang portion configured to overhang and be substantially free of the underlying flexible substrate such that the underlying flexible substrate can be strained independently from the overhang portion under operational strains of the flexible substrate,
  wherein the electronic component island is configured to extend beyond the area enclosed by the one or more connection-support pads so as to overlap one or more other neighbouring electronic component islands.

The apparatus may be one or more of an electronic device, a portable electronic device, a telecommunications device, a portable telecommunications device and a module for any of the aforementioned devices.

The steps of any method disclosed herein do not have to be performed in the exact order disclosed, unless explicitly stated or understood by the skilled person.

Corresponding computer programs (which may or may not be recorded on a carrier) for implementing one or more of the methods disclosed herein are also within the present disclosure and encompassed by one or more of the described example embodiments.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

DESCRIPTION OF SPECIFIC ASPECTS/EMBODIMENTS

Stretchable electronics is a composition of electronic materials and/or components formed across a substrate in a manner to allow the overall substrate to repeatedly deform (e.g. by more than approximately 5%) without electrical failure. Generally, the materials should not exceed their elastic limit (for repeated stretchability). Fully implementing flexible electronics may be limited by the ability of the components themselves to flex.

For example, connecting rigid islands having brittle electronic components to a flexible substrate may cause a clamping effect on the flexible substrate. That is, the flexible substrate cannot be stretched as it is limited by the connected rigid islands. Because each region containing an island cannot be stretched, the flexible substrate (and any associated interconnects) between the islands has to stretch more to achieve the same overall stretch of the apparatus.

For example, an apparatus might comprise a flexible substrate and multiple electronic islands. The electronics islands of this apparatus are connected to the flexible substrate across the entire surface area of the electronics islands, and the electronic islands (which are completely rigid) occupy half of a flexible substrate. For such an apparatus, if an overall stretch of the apparatus of 20% is required, then the flexible substrate (and any interconnecting circuitry) between the islands will have to stretch by 40%. This means that a stretchable device with non-stretchable islands covering the whole surface area may not be used to produce, for example, a display. In addition, clamping the substrate in this manner may also affect the overall feel of the device if large areas are clamped. This may be particularly important for wearable electronics.

There is disclosed an apparatus comprising a flexible substrate; and an overhanging electronic component island, the electronic component island configured to be less flexible than the flexible substrate and comprising one or more electronic components, wherein the electronic component island comprises a substrate-face with a connection portion and an overhang portion, the connection portion being mechanically coupled to a surface of the flexible substrate via a single connection-support pad and the overhang portion configured to overhang and be substantially free of the underlying flexible substrate such that the underlying flexible substrate can be strained independently from the overhang portion under operational strains of the flexible substrate.

Mechanically coupling only a portion of the electronic component island may allow a greater proportion surface of the device to be covered with rigid electronics whilst maintaining flexibility. In addition, larger islands may be formed at different heights so that they can be overlapped enabling a stretchable display for example (e.g. with more complete coverage of the display surface).

Figure 1A:
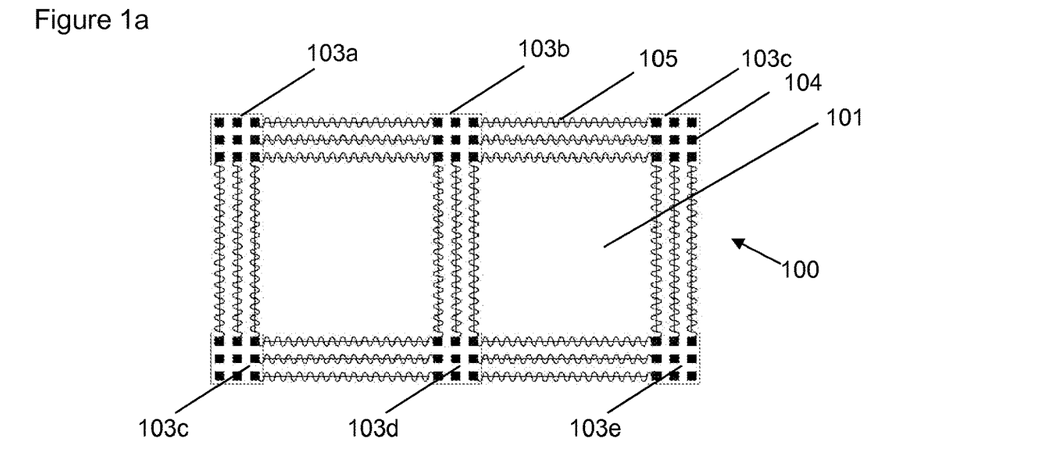
FIGS. 1a-1c depict an embodiment comprising multiple electronic component islands coupled to a flexible substrate.
Figure 1B:
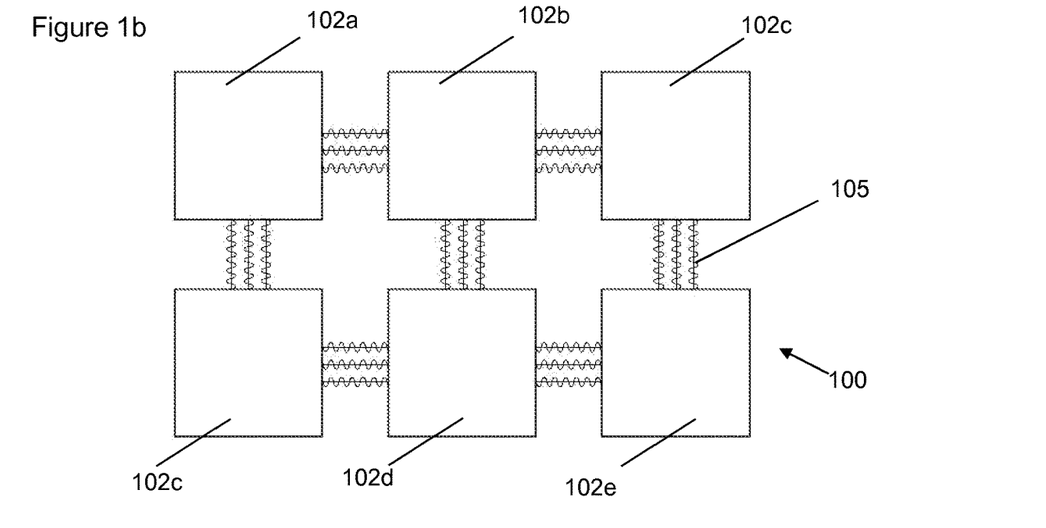
Figure 1C:
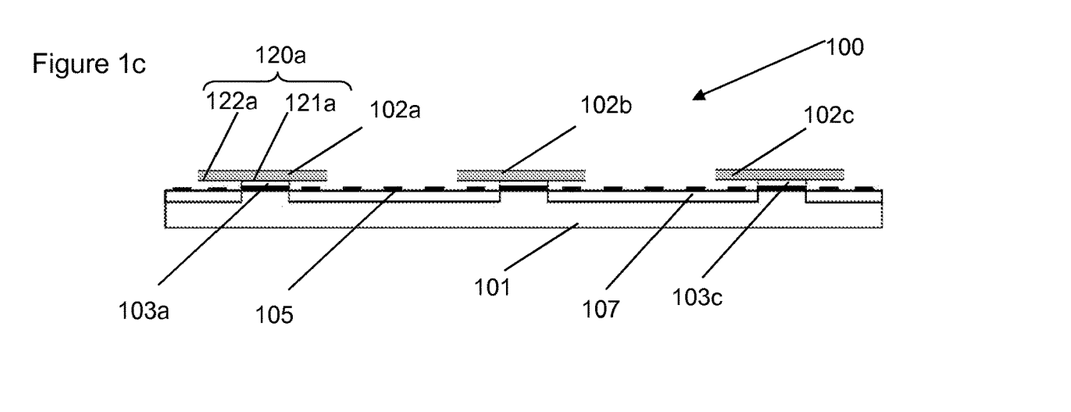

FIGS. 1a-1c depict respective plan (FIGS. 1a and 1b) and cross-section (FIG. 1c) views of a first embodiment of an apparatus 100 (e.g. a portion of a solar panel array) comprising a flexible substrate 101; and an overhanging electronic component island 102a, the electronic component island 102a configured to be less flexible than the flexible substrate 101 and comprising one or more electronic components (not shown), and wherein the electronic component island 102a comprises a substrate-face 120a with a connection portion 121a and an overhang portion 122a, the connection portion 121a being mechanically coupled to a surface of the flexible substrate 101 via a single connection-support pad 103a and the overhang portion 122a configured to overhang and be substantially free of the underlying flexible substrate 101 such that the underlying flexible substrate 101 can be strained independently from the overhang portion 122a under operational strains of the flexible substrate 101. In FIGS. 1a-1c, the apparatus 100 is shown in an unstrained configuration.

The term "flexible" is used to refer to material which may be bent, stretched, compressed, or otherwise strained. Thus the flexible substrate may be a bendable substrate, a stretchable substrate, and/or a compressible substrate. Accordingly the term "flexed" may be considered to relate to a strainable substrate and includes one or more of bending, stretching, and compressing. The flexible substrate may be resilient such that when deformed under stress it can return to its original shape when the stress is removed.

FIG. 1a is an overhead view of the flexible apparatus. The islands 101a-e are not shown in FIG. 1a so that the underlying structure can be seen. In this case, the apparatus 100 comprises six electronic connection-support pads 103a-e interconnected with stretchable suspended serpentine interconnects 105 (e.g. the interconnects comprising wire or conducting ink comprising arcuate segments which can deform when stretched without breaking the electrical connection) and all mounted on an elastomeric flexible substrate 101.

In this case, connection-support pads 103a-e comprise electrical connection points 104. Each connection-support pad 103a-e is configured to mechanically connect a respective electronic component island (e.g. by providing adhesive to bond the contiguous area between electrical connection points 104). That is, the connection support pad provide a single mechanical connection and a plurality of electrical connections. The plurality of electrical connections are configured to allow the one or more electronic components on the electronic component island to be electrically connected to the interconnects of the substrate.

In this case, the suspended serpentine interconnects 105 are formed on elastomeric beams all running in the same direction between neighbouring connection-support pads.

FIG. 1b is an overhead plan view of the apparatus with the electronic component islands 102a-e shown. In this case, the electronic component islands 102a-e are configured to be less flexible than the flexible substrate 101 and comprise one or more electronic components (e.g. solar panel components—not shown). In this case, each connection pads 103a-e are positioned within the edges (in this case, substantially centrally within the edges) of the respective corresponding electronic component island 102a-e.

FIG. 1c is a cross-section of the device of FIGS. 1a and 1b in a plane perpendicular to the surface of the flexible substrate. Each electronic component island 102a-e is substantially planar and is mechanically connected to the flexible substrate via the respective connection-support pad 103a-e. The electronic component island may be formed from, for example, polymers with modulus in the range of 1-15 GPa such as polyimide (PI), polyethylene naphthalate (PEN), and/or polyethylene terephthalate (PET). In other embodiments, stiffer materials (with modulus in the range 40 GPa to 1 TPa) such as diamond like diamond-like carbon (DLC) or SiN or graphene may be used. The rigidity of the island may be configured to stop the island from bending under its own weight or the weight of components to such an extent that it touches the underlying flexible substrate. The size of the electronic islands may be dependent on the function of the electronic components. For example, for pixels, the electronic component islands may be between 10 μm×10 μm up to 100 μm×100 μm. For circuit components, the islands may be up to 1 cm×1 cm. In this case, the electronic component islands 102a-e are configured to be positioned at the same height above the flexible substrate surface.

For certain embodiments, the connection-support pads and the electronic component island may comprise plastic (e.g. polyimide). For other embodiments, the electronic component island may comprise silicon and the connection-support pads may comprise plastic (e.g. polyimide). For other embodiments, the electronic component island may comprise plastic (e.g. polyimide) or silicon and the connection-support pads may comprise diamond like carbon or silicon nitride (e.g. the electronic component island may be formed of silicon and the connection-support pad formed of silicon nitride). In each of these cases, the flexible substrate may be formed from elastomer, for example.

The electronic component islands 102a-e each comprises a substrate-face 120a with a connection portion 121a and an overhang portion 122a, the connection portion 121a being mechanically coupled to a surface of the flexible substrate 101 via a single respective connection-support pad 103a and the overhang portion 122a configured to overhang and be free of the underlying flexible substrate 101 such that the underlying flexible substrate 101 can be strained independently from the overhang portion. In other embodiments (not shown) there may be a minimum of further connection of the overhang to the flexible substrate such that it is the substantially free so that it can still be strained independently from the underlying flexible substrate. For example, these additional connectors may be minor by-products of the manufacturing process, or be flexible so as not to transmit strain from the flexible substrate to the electronic component island under operational conditions.

In other words, the underlying substrate 101 may be bent or stretched (and/or compressed) without (substantial) corresponding bending or stretching (and/or compressing) strains being induced in the overhang portion 122a of the electronic component island. (It will be appreciated that, ideally, the whole of the component island should not be subjected to significant strain.) This in turn may allow the flexing and/or stretching of the flexible substrate 101 not to be impeded as much by the (relatively inflexible) electronic component island 102a as would be the case if, for example, the entire surface of the electronic component island 102a were mechanically coupled to the substrate 101.

In this case, the length of the connection portion 103a is between 30 and 40% of the overall length of the electronic component island 102a along both axes. In this case, the connection-support pad 103a is positioned within (e.g. and away from) the edges of the electronic component island 102a.

It will be appreciated that each electronic component island 102a-e comprises electrical connection points corresponding to the electrical connection points 104 of the respective connection-support pad 103a-e to allow connection between the electronic components of each respective electronic component island 102a-e and other electronic circuitry in the flexible substrate and in other electronic component islands.

It will be appreciated that in other example embodiments, the components of the electronic component islands may comprise one or more of: a rigid packaged electronic component such as a surface-mount (SMD) component (e.g., resistor, capacitor, inductor, diode, transistor, operational amplifier, light-emitting diode, sensor etc.); a rigid component such as a bare silicon-based component or a microchip; a flexible component (e.g., flexible light-emitting diode, or flexible sensor); a packaged component (e.g. a multi-pin chip); or a combination of one or more rigid or thin-film based electronic components (e.g. thin film battery or photovoltaic cell) mounted on a flexible module (smaller than the flexible substrate) which together make up the component with component connection-support pads.

Figure 2A:
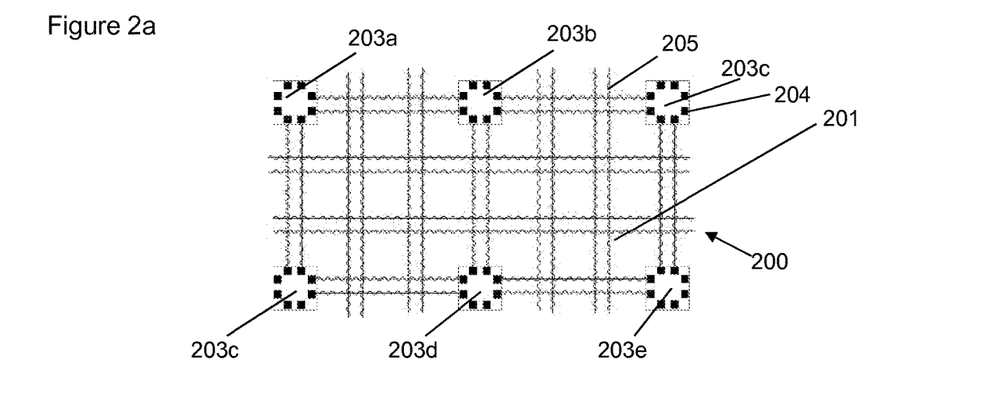
FIGS. 2a-2c depict an embodiment comprising multiple electronic component islands coupled to a flexible substrate.
Figure 2B:
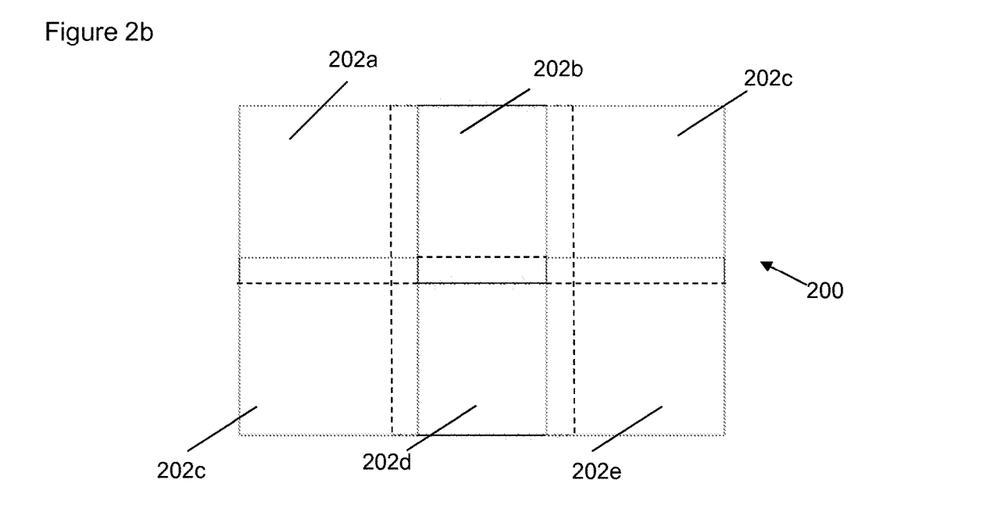
Figure 2C:
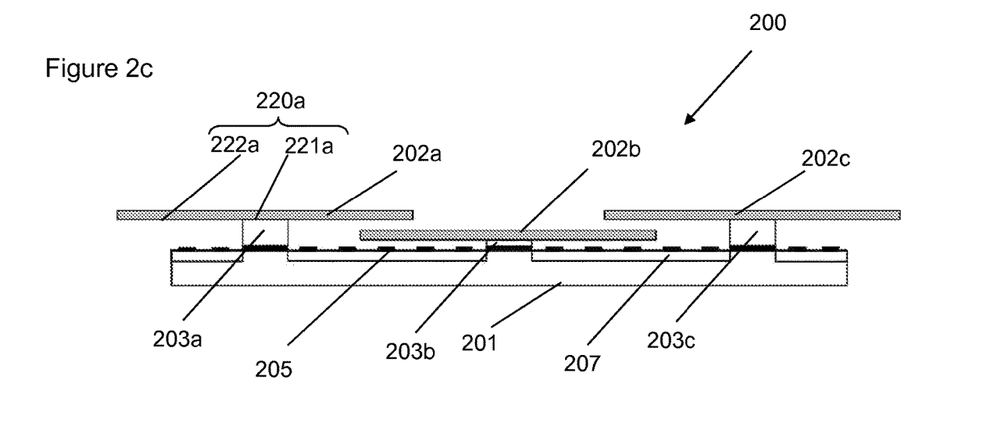

FIGS. 2a-2c depict a further embodiment of an apparatus 200 (e.g. a portion of a display) comprising a flexible substrate 201; and an overhanging electronic component island 202a, the electronic component island configured to be less flexible than the flexible substrate 101 and comprising one or more electronic components (e.g. display pixels—not shown), wherein the electronic component island 202a comprises a substrate-face 220a with a connection portion 221a and an overhang portion 222a, the connection portion 221a being mechanically coupled to a surface of the flexible substrate via a single connection-support pad 203a and the overhang portion 222a configured to overhang and be substantially free of the underlying flexible substrate 201 such that the underlying flexible substrate 201 can be strained independently from the overhang portion 222a under operational strains of the flexible substrate. In FIGS. 2a-2c, the apparatus is shown in an unstrained configuration.

FIG. 2a is an overhead view of a flexible apparatus. The islands are not shown in this figure so that the underlying structure can be seen. As in the previous embodiment, the apparatus comprises six electronic connection-support pads 203a-e interconnected with stretchable suspended serpentine interconnects 205 (e.g. the interconnects comprising wire or conducting ink comprising arcuate segments which can deform when stretched without breaking the electrical connection) and all mounted on an elastomeric flexible substrate 201.

Each connection-support pad 203a-e is configured to mechanically connect a respective electronic component island (e.g. by bonding). In this case, connection-support pads comprise electrical connection points 204. As shown in FIG. 2a, this embodiment comprises a number of serpentine interconnects 205 which connect electronic connection points 204 of different connection-support pads 203a-e. In this case, the suspended serpentines interconnects 205 may be formed on elastomeric beams running at right angles to each other. Each elastomeric beam may be a protruding section of the substrate mechanically connected to the substrate, on which the serpentines are supported. An elastomeric beam may be 1-20 times the width of the serpentine. It will be appreciated that other angles are possible.

FIG. 2b is an overhead plan view of the apparatus 200 with the electronic component islands 202a-e shown. In this case, the electronic component islands 202a-e are configured to be less flexible than the flexible substrate 201 and comprise one or more electronic components (not shown). In this case, each connection pads 203a-e is positioned within the edges (in this case, substantially centrally within the edges) of the corresponding electronic component island 202a-e.

The electronic component islands 202a-e each comprises a substrate-face 220a with a connection portion 221a and an overhang portion 222a, the connection portion being mechanically coupled to a surface of the flexible substrate 201 via a single respective connection-support pad 203a-c and the overhang portion 211a configured to overhang and be free of the underlying flexible substrate 201 such that the underlying flexible substrate 201 can be strained independently from the overhang portion. In this case, the length of the connection portion between 30 and 40% of the overall length of the electronic component island along both axis. In this case, the connection-support pad may be positioned within (e.g. and away from) the edges of the electronic component island.

FIG. 2c is a cross-section of the apparatus of FIGS. 2a and 2b in a plane perpendicular to the surface of the flexible substrate. Each electronic component island 202a-e is substantially planar and is mechanically connected to the flexible substrate 201 via the connection-support pad 203a-c. In this case, the connection support pads are in the form of pillars. The different heights of the pillars enable each electronic component island 202a-e to be positioned at a different height above the flexible substrate surface than neighbouring electronic component islands 202a-e to permit overlap between the neighbouring electronic component islands 202a-e.

As shown in FIG. 2c, the electronic component islands 202a-e are larger than the connection-support pads 203a-e and so each comprises a substrate-face 220a with a connection portion 221a and an overhang portion 222a. The overhang portion 222a is configured to overhang and be free of the underlying flexible substrate 201a such that the underlying flexible substrate 201 can be strained independently from the overhang portion 222a. In this case the underlying flexible substrate 201 may be indirectly below portions of some electronic component islands (e.g. 202a and 202c) as there may be intervening portions of other electronic component islands (e.g. 202b). In this case, each connection-support pad 203a-e is positioned within (e.g. and away from) the edges of the electronic component island.

In this case, each electronic component island 202a-e comprises electrical connection points corresponding to the electrical connection points 204 of the respective connection-support pad to allow connection between the electronic components of each electronic component island 202a-e and other electronic circuitry in the flexible substrate and in other electronic component islands.

Each electronic component island 202a-e in this case is substantially planar. In this case, each planar electronic component island 202a-e is configured to lie substantially parallel to the substrate 201 surface.

Although in an unstrained configuration, the electronic component islands in this example embodiment are overlapped, straining the device (e.g. uniaxially or biaxially) may allow the surface of the electronic component islands to become completely visible (depending on their dimensions and the overall stretch). This may be a desirable feature for a stretchable display or solar cells for example. The increased real estate may also allow for more planar ICs, or ICs with larger footprints to be located on the islands surface.

Figure 3A:
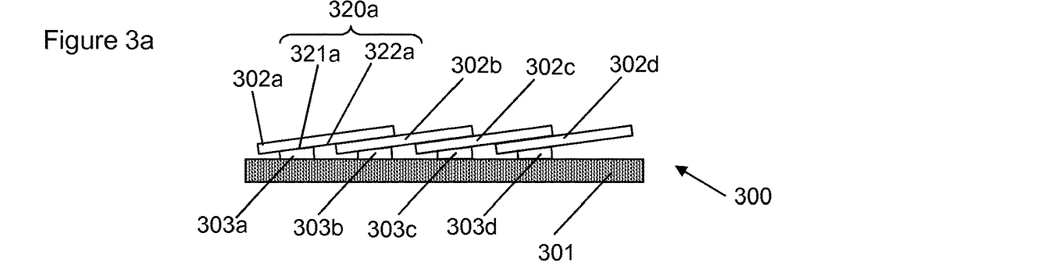
FIGS. 3a-3b depict an embodiment comprising multiple electronic component islands coupled to a flexible substrate.

FIG. 3a shows the cross section of a further embodiment 300 comprising a flexible substrate 301; and an overhanging electronic component island 302a, the electronic component island configured to be less flexible than the flexible substrate 101 and comprising one or more electronic components (not shown), wherein the electronic component island 302a comprises a substrate-face 320a with a connection portion 321a and an overhang portion 322a, the connection portion 321a being mechanically coupled to a surface of the flexible substrate via a single connection-support pad 303a and the overhang portion 322a configured to overhang and be substantially free of the underlying flexible substrate 301 such that the underlying flexible substrate 301 can be strained independently from the overhang portion 322a under operational strains of the flexible substrate.

In this example embodiment, each contact-support pad 303a-d is placed substantially at one edge of the respective electronic component island 302a-d, substantially in a cantilever configuration.

In this case, substantially planar electronic component islands 302a-d are placed at an angle (e.g. making an angle of between 5 and 45° to the plane of the flexible substrate 201) to the flexible substrate surface such that electronic component islands (e.g. 302b) are configured to be below a first neighbouring electronic component island (302a) on a first side and above a second neighbouring electronic component island (302c) on a second side. Such a configuration may provide more uniform bending. In other cantilever including configurations where adjacent islands do not overlap, the islands may not be angled and may be similar to the embodiments of FIGS. 1 and 2.

Figure 3B:
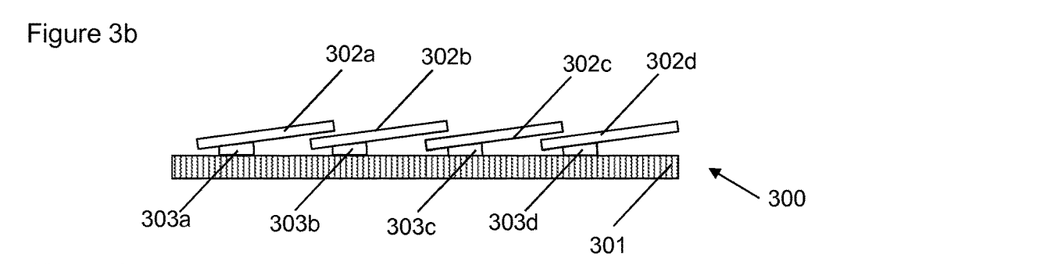

FIG. 3b shows a cross section of the embodiment of FIG. 3b undergoing a stretching strain. As shown in FIG. 3b, when undergoing a stretching strain, a greater proportion of the overlapping electronic islands surface is revealed.

FIG. 4a-4d show some options for the position of a connection-support pad with respect to the electronic component island. In each case, the connection-support pad is configured to enable the electronic component island to be attached to an underlying flexible substrate.

Figure 4A:
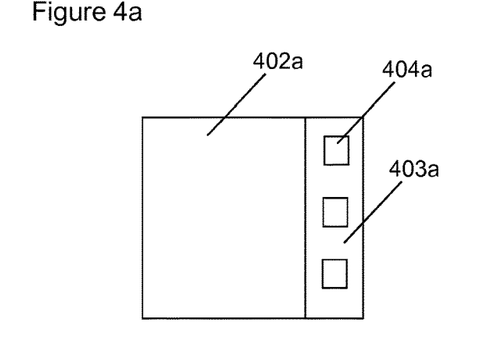
FIGS. 4a-4d depict alternative ways of positioning a connection-support pad with respect to the electronic component island.

FIG. 4a shows the connection-support pad 403a is positioned at an edge of the electronic component island 402a, substantially in a cantilever configuration. In this case, the length of the connection portion 403a is about 100% of the overall length of the electronic component island 402a along one axis (i.e. the connection portion extends along the entire length of one side); and between 10% and 20% of the overall length of the electronic component island 402a along a perpendicular axis.

Figure 4B:
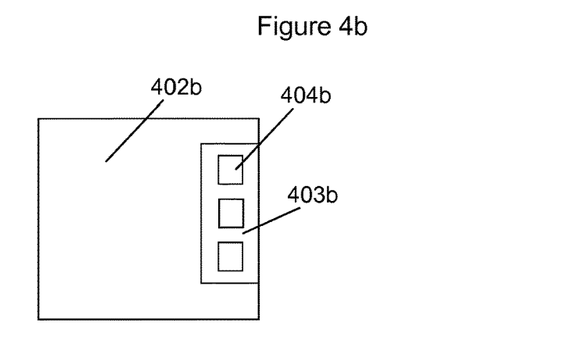

FIG. 4b shows the connection-support pad 403b is positioned at an edge of the electronic component island, substantially in a cantilever configuration. In this case, the length of the connection portion 403b is between 60% and 70% of the overall length of the electronic component island 402b along one axis; and between 10% and 20% of the overall length of the electronic component island 402b along a perpendicular axis.

Figure 4C:
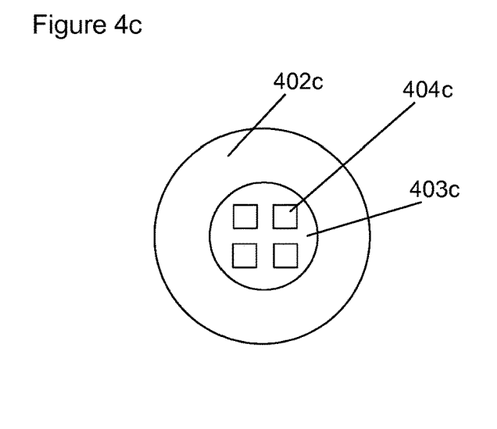

FIG. 4c shows a circular connection-support pad 403c positioned centrally with respect to the circular electronic component island 402c. In this case, the length of the connection portion is between 40% and 50% of the overall length of the electronic component island along all axes. It will be appreciated that the shape of the connection-support and the electronic component island may affect whether the apparatus stretches differently along different directions.

Figure 4D:
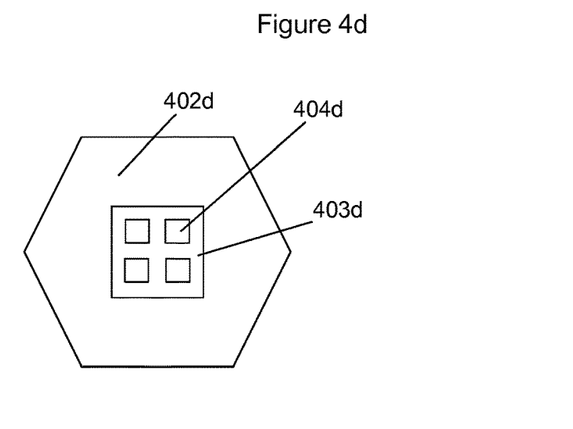

FIG. 4d shows a connection-support pad positioned 403d centrally with respect to the electronic component island 402d. FIG. 4d shows an electronic component island 402d having a hexagonal shape. In this case, the connection-support pad 403d is square shaped.

FIG. 5a-f illustrates a method to create an apparatus comprising: a flexible substrate; and an overhanging electronic component island, the electronic component island configured to be less flexible than the flexible substrate and comprising one or more electronic components, wherein the electronic component island comprises a substrate-face with a connection portion and an overhang portion, the connection portion being mechanically coupled to a surface of the flexible substrate via a single connection-support pad and the overhang portion configured to overhang and be substantially free of the underlying flexible substrate such that the underlying flexible substrate can be strained independently from the overhang portion under operational strains of the flexible substrate.

This method may be used to produce any of the previous embodiments. It will be appreciated that the produced islands may be electrically interconnected with a wide range of stretchable conductors or light guides, such as carbon nanotubes (CNT) or silver nanowires either on the surface of the elastomer or embedded in an elastomer, stretchable Au, silver, planar cu serpentines laminated to the substrate, flexible Si, or liquid metals.

Figure 5A:
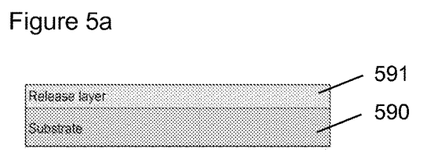
FIGS. 5a-5f depict a method of manufacturing an embodiment.

FIG. 5a shows a support substrate 590 on which is fabricated a release layer 591. The support substrate is configured to support the release layer when parts of the apparatus are being deposited onto the release layer. The support substrate may be rigid or may be flexible so that it can provide support when held taut (e.g. between successive rollers). The release layer is configured to allow easily removal of any parts of the apparatus which are constructed on the release layer. That is, the release layers is a temporary surface on which the apparatus can be constructed.

Figure 5B:
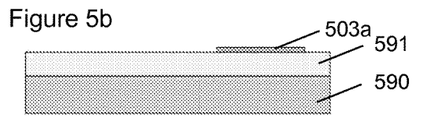
Figure 5C:
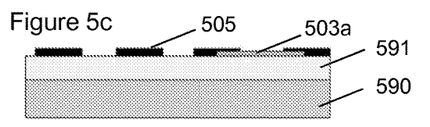

As shown in FIG. 5b, a connector-support pad base 503a is deposited on the surface of the release layer 591. The connector-support pad base 503a comprises through thickness contact electrical connection points (not shown). Then, as shown in FIG. 5c, the electrical interconnects 505 are provided to enable electrical connection between connector-support pad bases 503a. These interconnects 505 comprise one or more arcuate segments (e.g. serpentine shaped) so that they can maintain electrical connection even under strain. That is, they are configured to deform rather than break. The interconnects may be provided by electroplating or printing.

Figure 5D:
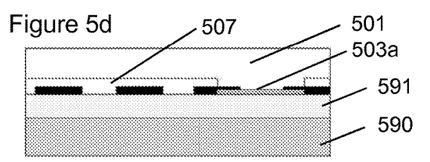
Figure 5E:
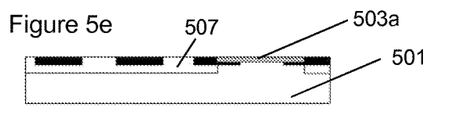

Then, as shown in FIG. 5d, the flexible (e.g. elastomeric) substrate 501 and flexible supporting structure 507 is provided to support the interconnects. In this case, the flexible substrate 501 may be provided using roll-to-roll lamination. In other embodiments, the flexible substrate 501 may be provided using wet cast techniques. Then the release layer 591 is removed (along with the support substrate) and the apparatus 500 inverted (as shown in FIG. 5e).

Figure 5F:
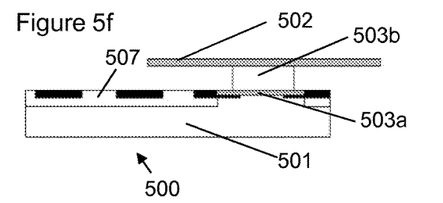

Then one or more electronic component islands 502 is bonded onto the connection pad, as shown in FIG. 5f. In this case, the electronic component island is connected to the flexible substrate via a connector-support pad pillar 503b which has a smaller cross-sectional area than the electronic component island and which spaces the island from the surface of the flexible substrate. The connector-support pad is configured to mechanically couple the electronic component island to a surface of the flexible substrate such that the electronic component island has an overhang portion configured to overhang and be substantially free of the underlying flexible substrate such that the underlying flexible substrate can be strained independently from the overhang portion under operational strains of the flexible substrate.

An alternative manufacturing approach is presented in FIGS. 6a-6f.

Figure 6A:
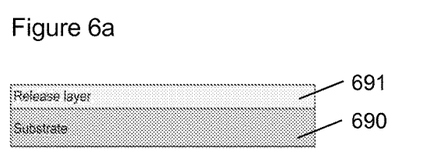
FIGS. 6a-6f depict a further method of manufacturing an embodiment.
Figure 6B:
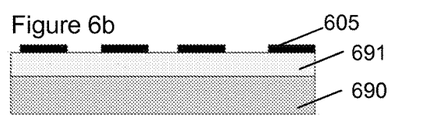
Figure 6C:
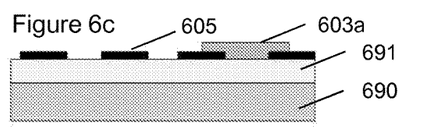

As with the previously described method, a release layer 691 is fabricated onto a substrate 690 (FIG. 6a). As shown in FIG. 6b, the electrical interconnects 605 are first provided on the surface of the release layer 691. These interconnects 605 comprise one or more arcuate segments (e.g. serpentine shaped) so that they can maintain electrical connection even under strain. That is, they are configured to deform rather than break. The interconnects 605 may be provided by electroplating or printing. Then, as shown in FIG. 6c, a connector-support pad base 603a is deposited so as to connect to the interconnects 605. The connector-support pad base 603a comprises through thickness contact electrical connection points. For example, connector-support pad base 603a may be formed of a polyimide Flexible Printed Circuit Board (FPCB). The interconnects may be fabricated using the same methods and at the same time so might be continuous. Other connection methods may include anisotropic conductive film (ACF) bonding or soldering. That is, the method of FIG. 6a-6f is similar to that of 5a-5f except that the interconnects and the connector-support pad base are provided in a different order.

Figure 6D:
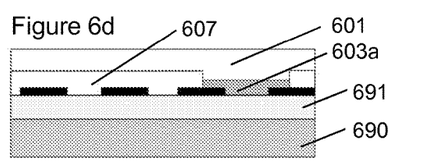
Figure 6E:
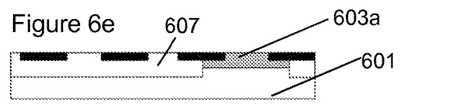

Then, as shown in FIG. 6d, the flexible (e.g. elastomeric) substrate 601 and flexible supporting structure 607 is provided to support the interconnects 605 and connector-support pad base 603a. In this case, the flexible substrate 601 may be provided using roll-to-roll lamination. In other embodiments, the flexible substrate 601 may be provided using wet cast techniques. Then the release layer 691 (and support substrate) is removed and the apparatus 600 inverted (as shown in FIG. 6e).

Figure 6F:
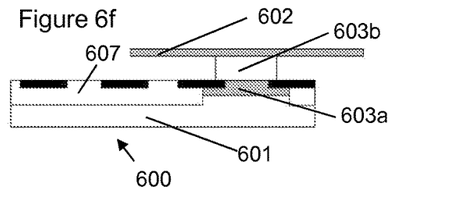

The electronic component island is then bonded onto the connection pad, as shown in FIG. 6f. In this case, the electronic component island is connected to the flexible substrate via a connector-support pad pillar 603b which spaces the island from the surface of the flexible substrate.

A further method of manufacture is described in FIGS. 7a-7g.

Figure 7A:
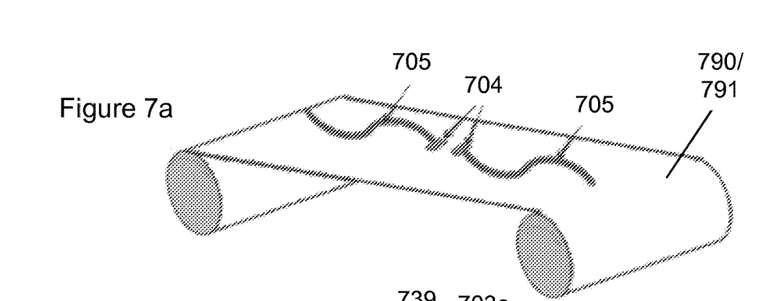
FIGS. 7a-7g depict a further method of manufacturing an embodiment.

As shown in FIG. 7a, interconnects (serpentines 705) and electrically conducting pads 704 are fabricated onto a flexible support substrate with a release layer 790/791. The interconnects 705 may be fabricated via electroplating or by direct printing. The interconnect material may comprise copper, silver, gold, conductive carbon, conductive polymer, silver nanowire, carbon nanotube or graphene. It will be appreciated that, instead of a single conductive serpentine interconnect (as shown in FIG. 7a), the meandering (or serpentine) interconnect structure may comprise several adjacent conductive serpentines terminated with individual connection-support pads.

Figure 7B:
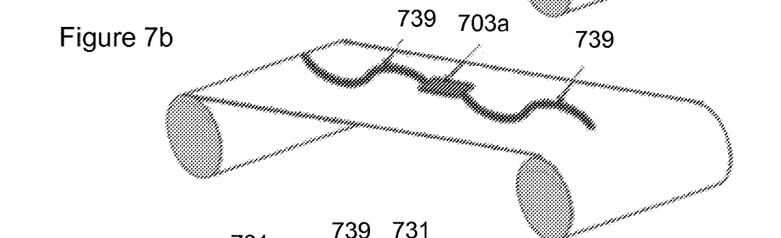

After the interconnects 705a have been fabricated, a support substrate 739 and 703a is printed over the conductive serpentine structures and electrically conducting pads. The support substrate 703a printed over the contact pads forms a connection-support pad base. The support substrate can be for example a UV curable polymer. This is shown in FIG. 7b.

Figure 7C:
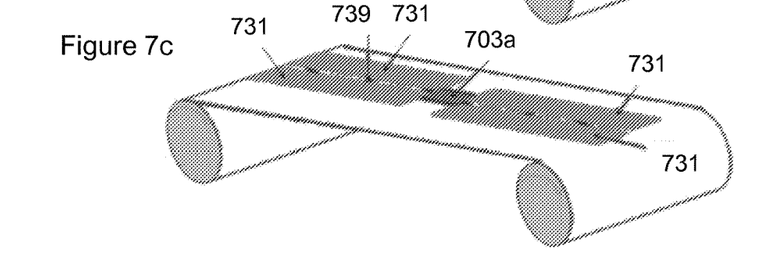
Figure 7D:
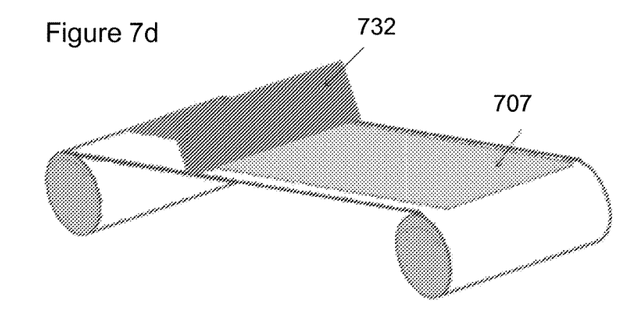

As shown in FIG. 7c, a sacrificial material 731 is then printed onto the structure to partially cover the serpentine interconnects 705 and corresponding support substrate 739 so that only small anchoring points (e.g. small relative to the length of the serpentine interconnect) along the centre line of the serpentine interconnects 705 are left exposed. As will be described below, this sacrificial layer will be removed at a later stage to disengage the interconnects from the supporting substrate (except for at the anchoring points). The sacrificial material can be for example based on trimethylolethane (TME). The sacrificial material is then cured as a solid layer.

A flexible substrate 701 (which in this case comprises elastomeric material) is then coated via wet-coating method such as doctor blading 732 (see FIG. 7d) and cross-linked (e.g. by heating, pressurizing, changing in pH, and/or radiating with radiation).

Figure 7E:
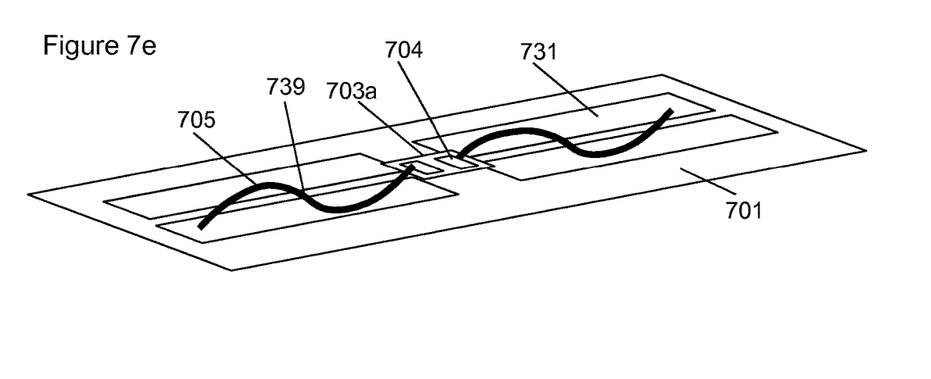

The fabricated structure is then released from the substrate 790/791. The resulting structure is shown in FIG. 7e.

Figure 7F:
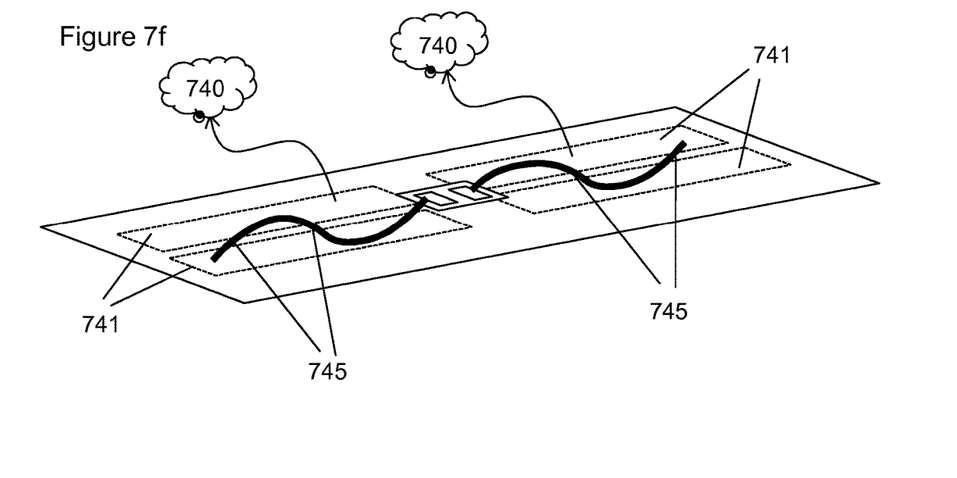

The sacrificial material 731 is then removed, as shown in FIG. 7f. In the case of trimethylolethane (TME), the sacrificial material is removed via sublimation 740. Once the sacrificial material is removed, air cavities 741 are formed under the serpentine structures 705 except for the supporting beam providing anchoring points 745 for the serpentines.

Figure 7G:
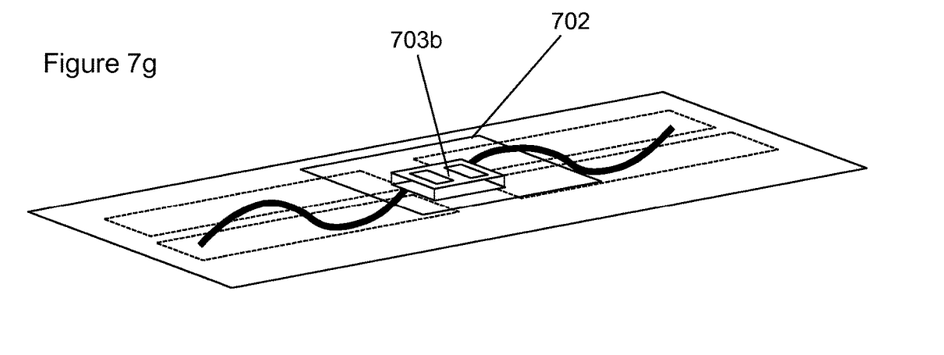

As shown in FIG. 7g, each electronic component island 702 (which is depicted as being transparent in FIG. 7g so the underlying structure can be seen) is then bonded to the connection-support pad base 703a via a connection-support pad pillar 703b. In this way an apparatus is manufactured, the apparatus comprising: a flexible substrate; and an overhanging electronic component island, the electronic component island configured to be less flexible than the flexible substrate and comprising one or more electronic components, wherein the electronic component island comprises a substrate-face with a connection portion and an overhang portion, the connection portion being mechanically coupled to a surface of the flexible substrate via a single connection-support pad and the overhang portion configured to overhang and be substantially free of the underlying flexible substrate such that the underlying flexible substrate can be strained independently from the overhang portion under operational strains of the flexible substrate.

It may be desirable to make multi-layered circuit boards with electronic component islands for some stretchable electronics applications. The embodiments described above can be modified to enable multi-layered circuit boards to be fabricated. In multiple layer embodiments, the multiple substrate layers should be separated so that the large islands don't come into contact with any other islands, substrate or conductors, even during operational straining (e.g. stretching, compression or bending). This may be achieved using spacers (e.g. which are relatively rigid compared to the flexible substrate). These spacers may include substrate thickness spacers configured to pass through the thickness of the flexible substrate in order, for example, to restrict motion between electronic component islands and interconnects positioned on either surface of the same flexible substrate. Other spacers may be substrate connector spacers configured to restrict motion between flexible substrates of different layers.

Figure 8:
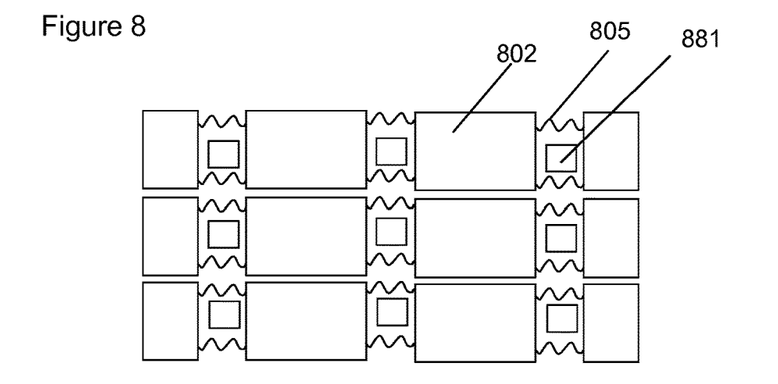
FIG. 8 is an overhead view of an embodiment configured to enable multilayer embodiments to be constructed.

FIG. 8 illustrates a planar view of an embodiment 800a with spacers 881 spaced out across the flexible substrate 801 surface. As with previous embodiments, the apparatus comprises: a flexible substrate 801; and an overhanging electronic component island 802, the electronic component island 802 configured to be less flexible than the flexible substrate and comprising one or more electronic components, wherein the electronic component island 802 comprises a substrate-face with a connection portion and an overhang portion, the connection portion being mechanically coupled to a surface of the flexible substrate 801 via a single connection-support pad and the overhang portion configured to overhang and be substantially free of the underlying flexible substrate such that the underlying flexible substrate can be strained independently from the overhang portion under operational strains of the flexible substrate.

The substrate connector spacers 881 are positioned between neighbouring electronic component islands 802 and are configured to have a height such that when the multiple layers are placed on top of each other, a vertical gap is maintained between the substrates of the multiple layers. The substrate connector spacers 881 may also have conductive pads and vias running from the top and bottom surface to allow the different layers to be electrically connected.

Figure 9:
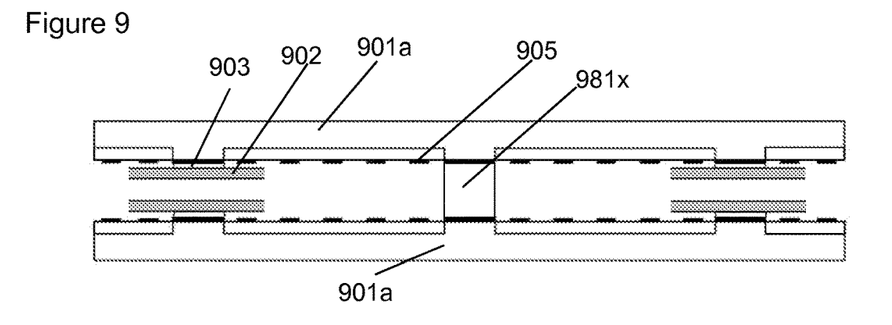
FIG. 9 is a cross-section of an embodiment configured to enable multilayer embodiments to be constructed.
Figure 10:
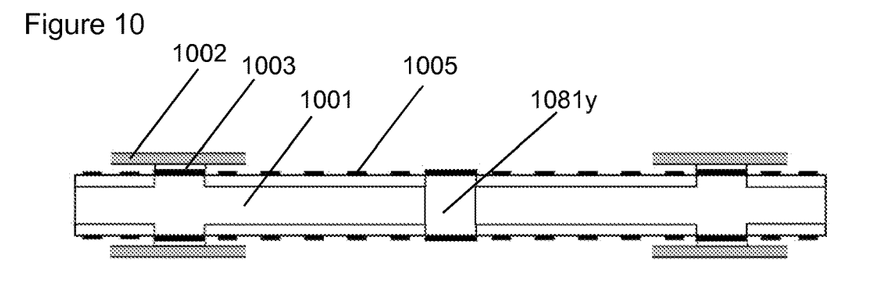
FIG. 10 is a cross-section of an embodiment configured to enable multilayer embodiments to be constructed.

Two configurations are shown in FIGS. 9 and 10, which could be used to create a multilayer board (e.g. a two-layer board). It will be appreciated that a combination of one or both configurations may be used to provide flexible boards with more than two layers.

FIG. 9 shows a cross sectional view of an embodiment comprising of two stretchable substrates 901a, 901b connected and separated by a substrate connector spacer 981x. The upper and lower layers may be fabricated in the same manner as detailed in FIGS. 7a-7g with the addition of the substrate connector spacer, which can be anisotropic conductive film (ACF) bonded in the same step as the large islands. In a further step the two layers can then be roll laminated together to bond all of the substrate connector spacers together.

FIG. 10 shows a cross sectional view of two stretchable circuit layers separated by the substrate. This can be fabricated by following the same fabrication steps for each layer as illustrated in FIGS. 7a-7g, followed by bonding the substrate thickness spacers 1081y to one of the layers. The two circuit layers can then be roll laminated together and elastomer injected between the two layers. Finally the electrical circuits are released from their substrates to form the device.

To allow multi-layered devices with more than two layers to be fabricated, it will be appreciated that the configurations of FIGS. 9 and 10 may be combined.

The use of flexible substrates, and curved interconnections as described herein, may be for flexible/stretchable circuit boards which extend across the hinge between a keyboard and display of a laptop computer, for example.

Figure 11:
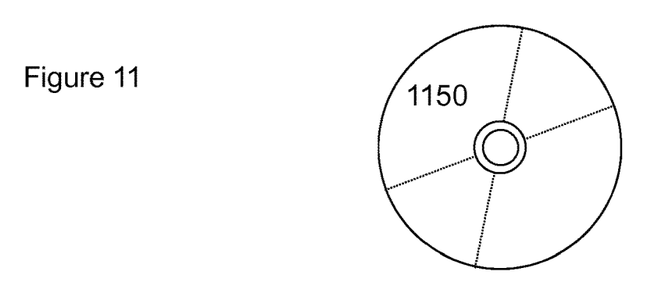
FIG. 11 shows a computer-readable medium comprising a computer program configured to perform a method or methods according to the present disclosure.

FIG. 11 illustrates schematically a computer/processor readable medium 1150 providing an example computer program configured to carry out any of the methods described herein (e.g., computer control of external equipment configured to prepare an apparatus according to a method as disclosed herein). In this example, the computer/processor readable medium 1150 is a disc such as a digital versatile disc (DVD) or a compact disc (CD). In other embodiments, the computer/processor readable medium 1150 may be any medium that has been programmed in such a way as to carry out an inventive function. The computer/processor readable medium 1150 may be a removable memory device such as a memory stick or memory card (SD, mini SD, micro SD or nano SD).

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

With reference to any discussion of any mentioned computer and/or processor and memory (e.g. including ROM, CD-ROM etc.), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising: a flexible substrate; a single connection-support pad connected to the flexible substrate, wherein the single connection-support pad includes one or more parts that form a single unit; and an overhanging electronic component island, the electronic component island configured to be less flexible than the flexible substrate and comprising one or more electronic components, wherein the electronic component island is directly coupled to the single connection-support pad, wherein the electronic component island comprises a substrate-face with a connection portion and an overhang portion that extends beyond the single connection-support pad, the connection portion being mechanically coupled to a surface of the flexible substrate via the single connection-support pad and the overhang portion configured to overhang and be substantially free of the flexible substrate such that the flexible substrate can be strained independently from the overhang portion under operational strains of the flexible substrate, wherein the electronic component island is positioned at a different height above the flexible substrate surface than a neighboring electronic component island to permit overlap between the electronic component island and the neighboring electronic component island, and wherein an electrical connection of the single connection-support pad is stretchable.

2. The apparatus of claim 1, wherein the single connection-support pad is configured to provide support to the electronic component island to keep the electronic component island away from the flexible substrate in an overhanging position.

3. The apparatus of claim 2, wherein adhesion of the single connection-support pad to the electronic component island and the flexible substrate is configured to provide support for the electronic component island.

4. The apparatus of claim 1, wherein, in an unstrained configuration, the electronic component island is configured to extend beyond an area enclosed by the single connection-support pad of the electronic component island so as to overlap one or more other neighboring electronic component islands.

5. The apparatus of claim 1, wherein the single connection-support pad and the electronic component island are configured to electrically connect the one or more electronic components to the flexible substrate.

6. The apparatus of claim 1, wherein the single connection-support pad is positioned at an edge of the electronic component island, substantially in a cantilever configuration.

7. The apparatus of claim 1, wherein a length of the connection portion is less than 50% of an overall length of the electronic component island along at least one axis.

8. The apparatus of claim 1, wherein a length of the connection portion is less than one of 45%, 40%, 35%, 30%, 25%, 20%, 15%, 10%, 5% of an overall length of the electronic component island along at least one axis.

9. The apparatus of claim 1, wherein a length of the connection portion is in the range of one of 45%-40%, 40%-35%, 35%-30%, 30%-25%, 25%-20%, 20%-15%, 15%-10%, 10%-5%, 5%-3% of an overall length of the electronic component island along at least one axis.

10. The apparatus of claim 1 wherein the operational strains of the flexible substrate are of an order of at least one of between 5 and 10%; between 5 and 20%; between 5 and 30%; and between 5 and 40%.

11. The apparatus of claim 1, wherein the apparatus comprises multiple layers, each layer comprising a flexible substrate and coupled electronic component islands.

12. The apparatus of claim 11, wherein the electronic component islands are spaced apart during operational straining by spacers, the spacers being rigid relative to the flexible substrate.

13. The apparatus of claim 1, wherein the apparatus comprises part of packaging, a wearable device, a wearable sensor, a biosensor, or a portable electronic device.

14. A method of manufacturing an apparatus comprising:
providing a flexible substrate;
providing a single connection-support pad connected to the flexible substrate, wherein the single connection-support pad includes one or more parts that form a single unit; and
providing an overhanging electronic component island, the electronic component island configured to be less flexible than the flexible substrate and comprising one or more electronic components, wherein the electronic component island is directly coupled to the single connection-support pad,
wherein the electronic component island comprises a substrate-face with a connection portion and an overhang portion that extends beyond the single connection-support pad, the connection portion being mechanically coupled to a surface of the flexible substrate via the single connection-support pad and the overhang portion configured to overhang and be substantially free of the flexible substrate such that the flexible substrate can be strained independently from the overhang portion under operational strains of the flexible substrate;
wherein the electronic component island is provided at a different height above the flexible substrate surface than a neighboring electronic component island to permit overlap between the electronic component island and the neighboring electronic component island; and
wherein an electrical connection of the single connection-support pad is stretchable.

15. The method of claim 14, wherein at least one of the flexible substrate and the overhanging electronic component island is provided using roll-to-roll lamination techniques.

16. The method of claim 14, wherein at least one of the flexible substrate and the overhanging electronic component island is provided using roll-to-roll printing techniques.

17. The method of claim 14, wherein the method comprising providing multiple layers, each layer comprising a flexible substrate and coupled electronic component islands.

18. The method of claim 14, wherein a sacrificial material is used to support parts of the apparatus as they are being formed, and wherein the sacrificial material is removed after the supported parts have been formed to decouple the parts from the underlying structure.

19. An apparatus comprising:
a flexible substrate;
at least one connection-support pad connected to the flexible substrate, wherein each of the at least one connection-support pad includes one or more parts that form a single unit; and
an overhanging electronic component island, the electronic component island configured to be less flexible than the flexible substrate and comprising one or more electronic components, wherein the electronic component island is directly coupled to the at least one connection-support pad,
wherein the electronic component island comprises a substrate-face with a connection portion and an overhang portion that extends beyond the at least one connection-support pad, the connection portion being mechanically coupled to a surface of the flexible substrate via the at least one connection-support pad and the overhang portion configured to overhang and be substantially free of the flexible substrate such that the flexible substrate can be strained independently from the overhang portion under operational strains of the flexible substrate,
wherein the electronic component island is configured to extend beyond an area enclosed by the at least one connection-support pad so as to overlap one or more other neighboring electronic component islands,
wherein the electronic component island is positioned at a different height above the flexible substrate surface than a neighboring electronic component island to permit overlap between the electronic component island and the neighboring electronic component island and wherein an electrical connection of the single connection-support pad is stretchable.

* * * * *